(12) United States Patent
Miao et al.

(10) Patent No.: US 10,833,158 B2
(45) Date of Patent: Nov. 10, 2020

(54) III-V SEGMENTED FINFET FREE OF WAFER BONDING

(71) Applicant: International Business Machines Corporation, Armonk, NY (US)

(72) Inventors: Xin Miao, Albany, NY (US); Chen Zhang, Albany, NY (US); Kangguo Cheng, Schenectady, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/558,357

(22) Filed: Sep. 3, 2019

(65) Prior Publication Data

US 2020/0006485 A1    Jan. 2, 2020

Related U.S. Application Data

(63) Continuation of application No. 15/971,529, filed on May 4, 2018, now abandoned.

(51) Int. Cl.
*H01L 21/00* (2006.01)
*H01L 29/00* (2006.01)
(Continued)

(52) U.S. Cl.
CPC .... *H01L 29/0847* (2013.01); *H01L 21/02241* (2013.01); *H01L 21/823431* (2013.01); *H01L 29/6681* (2013.01); *H01L 29/785* (2013.01)

(58) Field of Classification Search
CPC ....... H01L 21/02241; H01L 21/823431; H01L 21/02603; H01L 21/8221; H01L 21/2654; H01L 29/78618; H01L 29/78696; H01L 29/785; H01L 29/66545; H01L 29/6681; H01L 29/0847; H01L 29/78681; H01L 29/6674

See application file for complete search history.

(56) References Cited

U.S. PATENT DOCUMENTS

| 6,542,528 B1 | 4/2003 | Sato et al. |
| 7,709,277 B2 | 5/2010 | Lee et al. |

(Continued)

FOREIGN PATENT DOCUMENTS

| CN | 102623322 B | 7/2014 |
| CN | 102623347 B | 10/2014 |

(Continued)

OTHER PUBLICATIONS

Choquette et al., "Advances in Selective Wet Oxidation of AlGaAs Alloys," IEEE Journal of Selected Topics in Quantum Electronics, vol. 3, No. 3, Jun. 1997, pp. 916-926.

(Continued)

*Primary Examiner* — Nikolay K Yushin
(74) *Attorney, Agent, or Firm* — Cantor Colburn LLP; Robert Sullivan

(57) ABSTRACT

A technique relates to a semiconductor device. A stack is formed of alternating layers of inserted layers and channel layers on a substrate. Source or drain (S/D) regions are formed on opposite sides of the stack. The inserted layers are converted into oxide layers. Gate materials are formed on the stack.

20 Claims, 5 Drawing Sheets

(51) Int. Cl.
*H01L 29/08* (2006.01)
*H01L 29/66* (2006.01)
*H01L 21/02* (2006.01)
*H01L 21/8234* (2006.01)
*H01L 29/78* (2006.01)

(56) References Cited

U.S. PATENT DOCUMENTS

| | | | |
|---|---|---|---|
| 7,932,160 B2 | 4/2011 | Almuneau et al. | |
| 8,293,608 B2 | 10/2012 | Orlowski et al. | |
| 8,729,638 B2 | 5/2014 | Zhu et al. | |
| 8,753,942 B2 | 6/2014 | Kuhn et al. | |
| 8,937,299 B2 | 1/2015 | Basu et al. | |
| 9,184,269 B2 | 11/2015 | Ching et al. | |
| 9,224,809 B2 | 12/2015 | Li et al. | |
| 9,306,019 B2 | 4/2016 | Wan et al. | |
| 9,362,355 B1 | 6/2016 | Cheng et al. | |
| 9,548,355 B1 | 1/2017 | Cheng et al. | |
| 9,627,276 B2 | 4/2017 | Leobandung | |
| 9,728,621 B1 | 8/2017 | Cheng et al. | |
| 9,755,082 B2 | 9/2017 | Yamazaki | |
| 9,911,592 B2 * | 3/2018 | Doris | H01L 29/0673 |
| 10,236,381 B2 | 3/2019 | Cheng et al. | |
| 2008/0135949 A1 | 6/2008 | Lo et al. | |
| 2011/0031473 A1 | 2/2011 | Chang et al. | |
| 2011/0303914 A1 | 12/2011 | Yamazaki | |
| 2012/0138886 A1 | 6/2012 | Kuhn et al. | |
| 2013/0146942 A1 | 6/2013 | Zhu et al. | |
| 2015/0008501 A1 | 1/2015 | Sakuma et al. | |
| 2015/0076606 A1 | 3/2015 | Cheng et al. | |
| 2015/0333162 A1 | 11/2015 | Bouche et al. | |
| 2016/0049489 A1 | 2/2016 | Wan et al. | |
| 2016/0111338 A1 | 4/2016 | Loubet et al. | |
| 2017/0069481 A1 * | 3/2017 | Doris | H01L 29/66545 |

FOREIGN PATENT DOCUMENTS

| | | |
|---|---|---|
| CN | 103107192 B | 5/2016 |
| CN | 105789048 A | 7/2016 |

OTHER PUBLICATIONS

Zheng et al.; "Simulation-Based Study of the Inserted-Oxide FinFET for Future Low-Power System-on-Chip Applications"; IEEE Electron Device Letters; vol. 36; No. 8; Aug. 2015; pp. 742-744.

Singh et al., "Analytical Modeling of Parasitic Capacitance in Inserted-Oxide FinFETs," IEEE Transactions on Electron Devices, 2017.

Zheng et al., "Inserted-oxide FinFET (iFinFET) Design to Extend CMOS Scaling," International Symposium on VLSI Technology, Systems and Application (VLSI-TSA), 2015. IEEE, 2 pages.

List of IBM Patents or Patent Applications Treated As Related; (Appendix P), Filed Sep. 3, 2019; 2 pages.

Miao, Xin et al., Pending U.S. Appl. No. 15/971,529 entitled "III-V Segmented FinFET Free of Wafer Bonding", filed May 4, 2018.

* cited by examiner

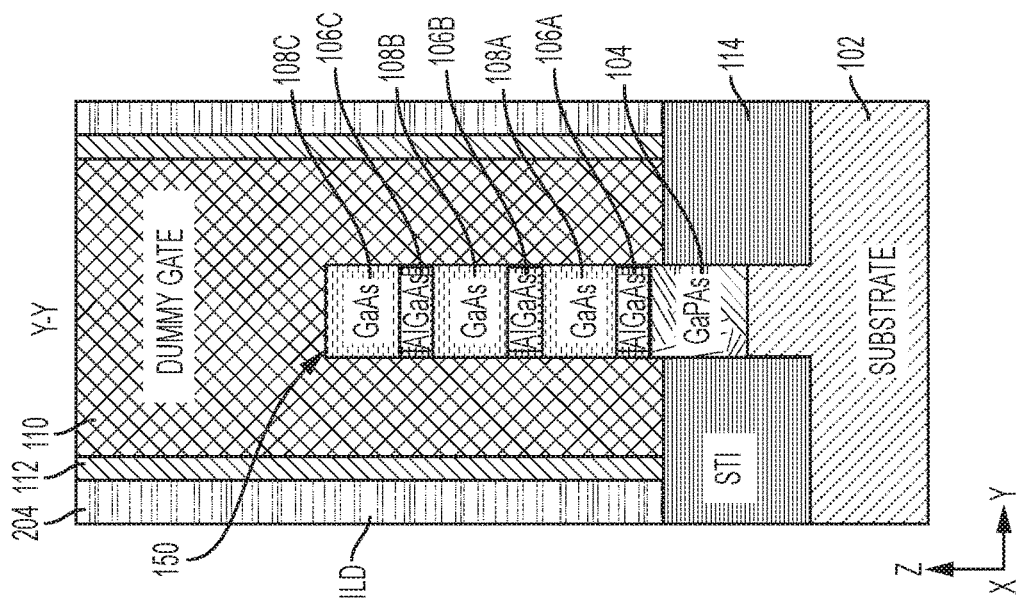
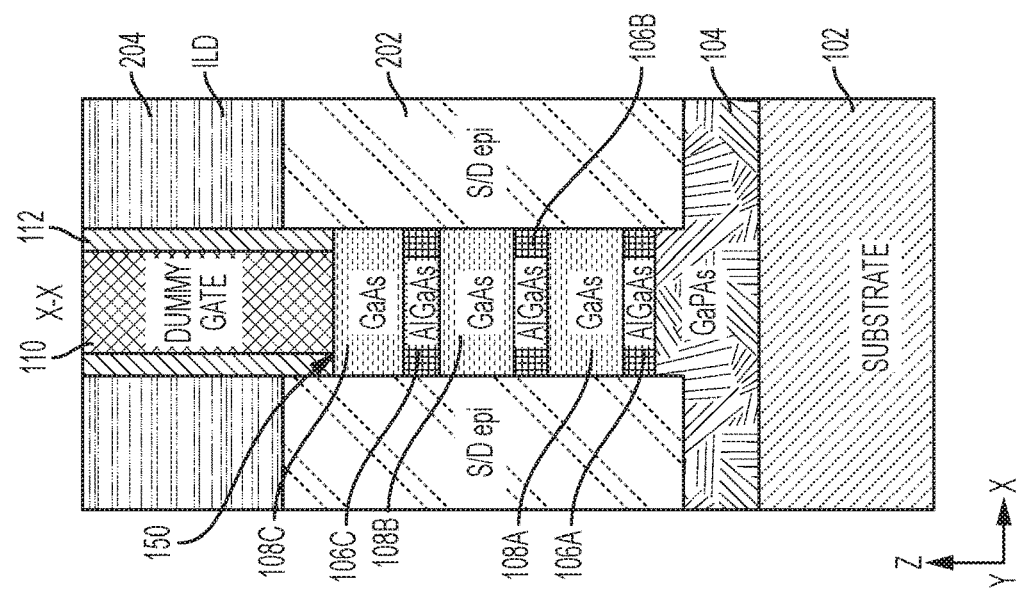
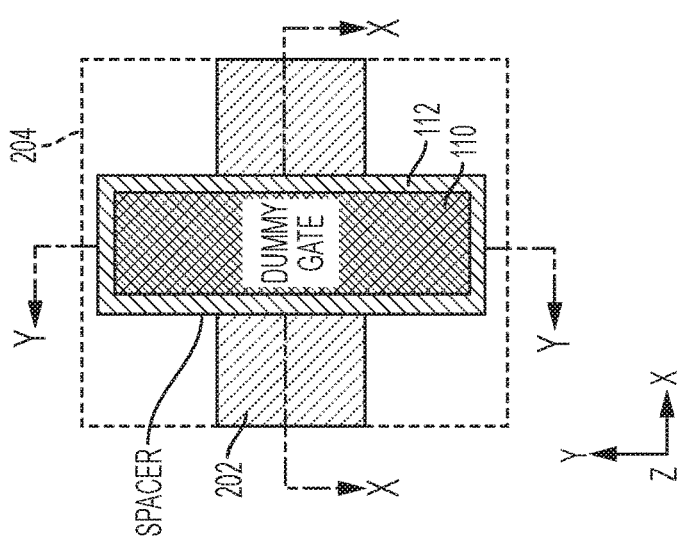
FIG. 2A
FIG. 2B
FIG. 2C

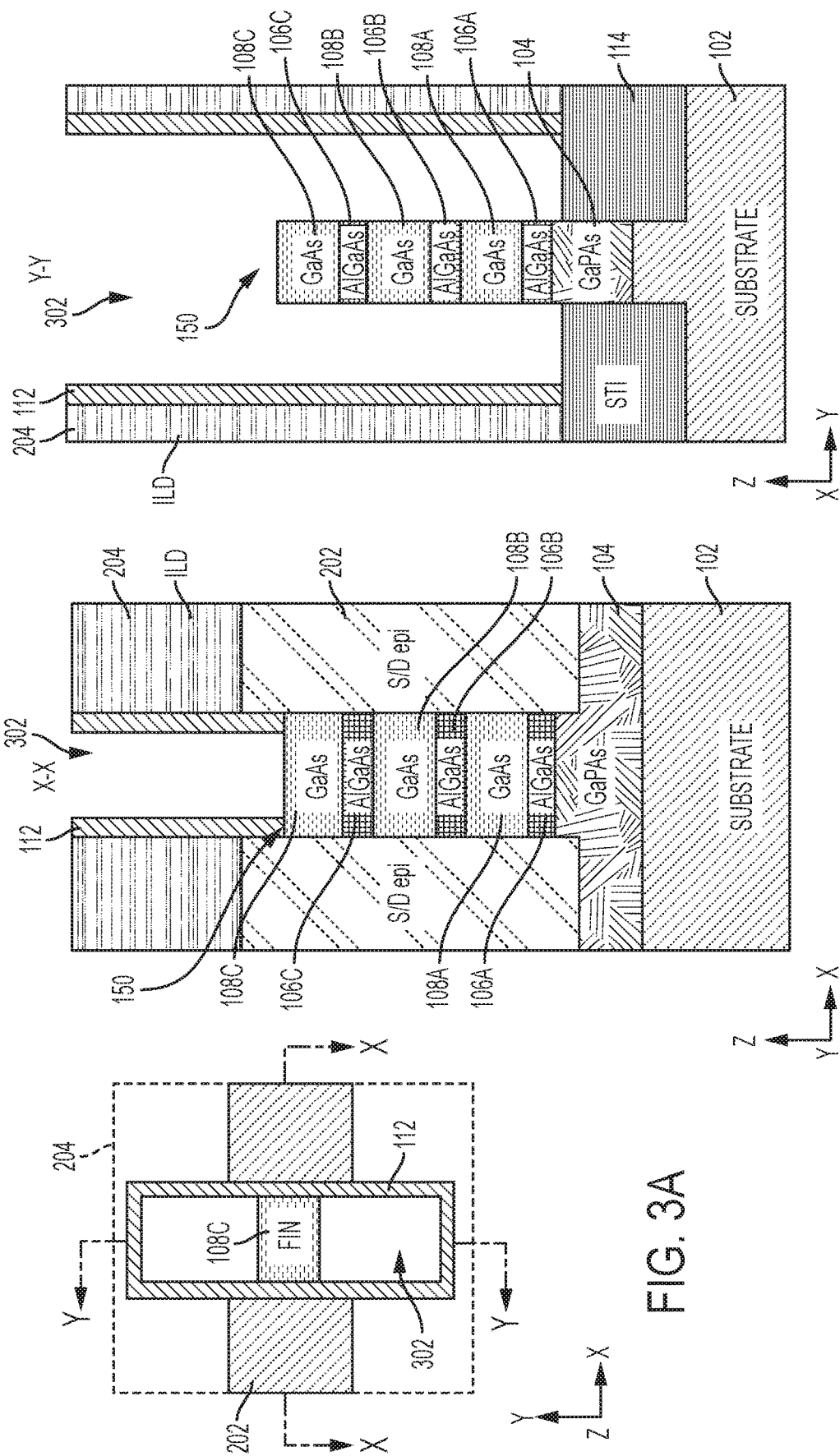

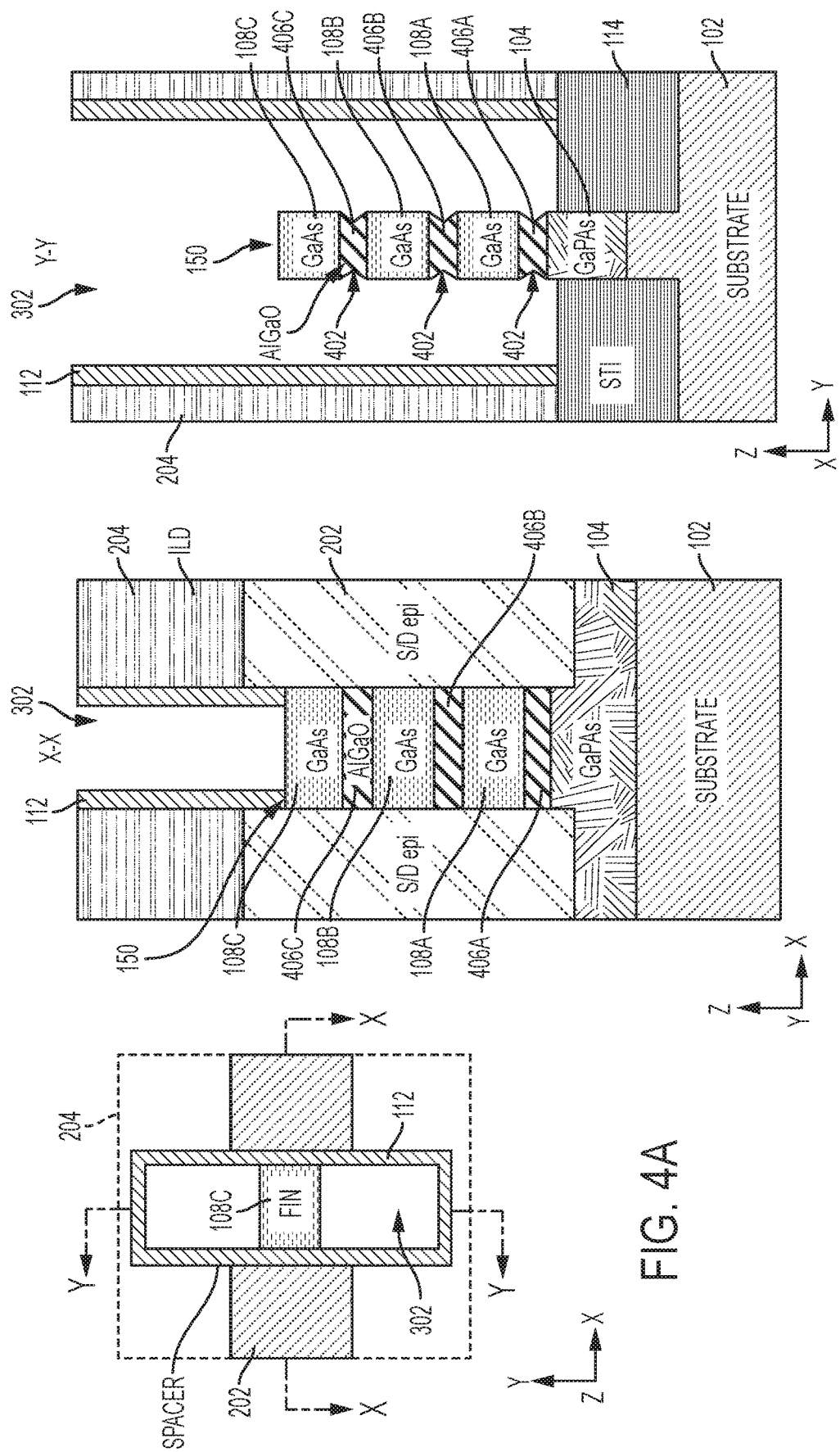

III-V SEGMENTED FINFET FREE OF WAFER BONDING

DOMESTIC PRIORITY

This application is a continuation of U.S. patent application Ser. No. 15/971,529, filed May 4, 2018, the disclosure of which is incorporated by reference herein in its entirety.

BACKGROUND

The present invention generally relates to fabrication methods and resulting structures for semiconductor devices, and more specifically, to a III-V segmented FinFET free of wafer bonding.

A metal-oxide-semiconductor field-effect transistor (MOSFET) is used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

The III-V semiconductor FinFET is a MOSFET device that mitigates the effects of short channels and reduces drain-induced barrier lowering. Due to improved short channel effects, the FinFET is a widely used form of geometrically-scaled FETs. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length (gate width) can be achieved in a given region of the substrate as opposed to a planar FET device. The FinFET multi-gate transistor structure is widely used in 14/16 nm generation complementary metal-oxide-semiconductor (CMOS) technologies. To enable gate-length scaling, gate-all-around (GAA) field effect transistors (FET) have been developed. Although the GAA FET structure can provide superior electrostatics, it comes with process challenges such as forming spacers and filling gate metal between nanowires.

SUMMARY

Embodiments of the invention are directed to a method for forming a semiconductor device. A non-limiting example of the method includes forming a stack of alternating layers of inserted layers and channel layers on a substrate and forming source or drain (S/D) regions on opposite sides of the stack. The method includes converting the inserted layers into oxide layers and forming gate materials on the stack.

Embodiments of the invention are directed to a semiconductor device. A non-limiting example of the semiconductor device includes a stack of alternating layers of oxide layers and channel layers on a substrate, the oxide layers having an indented middle portion. The semiconductor device includes source or drain (S/D) regions on opposite sides of the stack and gate materials on the stack.

Embodiments of the invention are directed to a method for forming a semiconductor device. A non-limiting example of the method includes forming a stack of alternating layers of oxide layers and channel layers on a substrate, the oxide layers having an indented middle portion. The method includes forming source or drain (S/D) regions on opposite sides of the stack and forming gate materials on the stack.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a top view of the semiconductor device after fabrication operations according to embodiments of the invention;

FIG. 2B depicts a cross-sectional view of the semiconductor device shown in FIG. 2A taken along line X-X;

FIG. 2C depicts a cross-sectional view of the semiconductor device shown in FIG. 2A taken along line Y-Y;

FIG. 3A depicts a top view of the semiconductor device after fabrication operations according to embodiments of the invention;

FIG. 3B depicts a cross-sectional view of the semiconductor device shown in FIG. 3A taken along line X-X;

FIG. 3C depicts a cross-sectional view of the semiconductor device shown in FIG. 3A taken along line Y-Y;

FIG. 4A depicts a top view of the semiconductor device after fabrication operations according to embodiments of the invention;

FIG. 4B depicts a cross-sectional view of the semiconductor device shown in FIG. 4A taken along line X-X;

FIG. 4C depicts a cross-sectional view of the semiconductor device shown in FIG. 4A taken along line Y-Y;

Figure 1C:
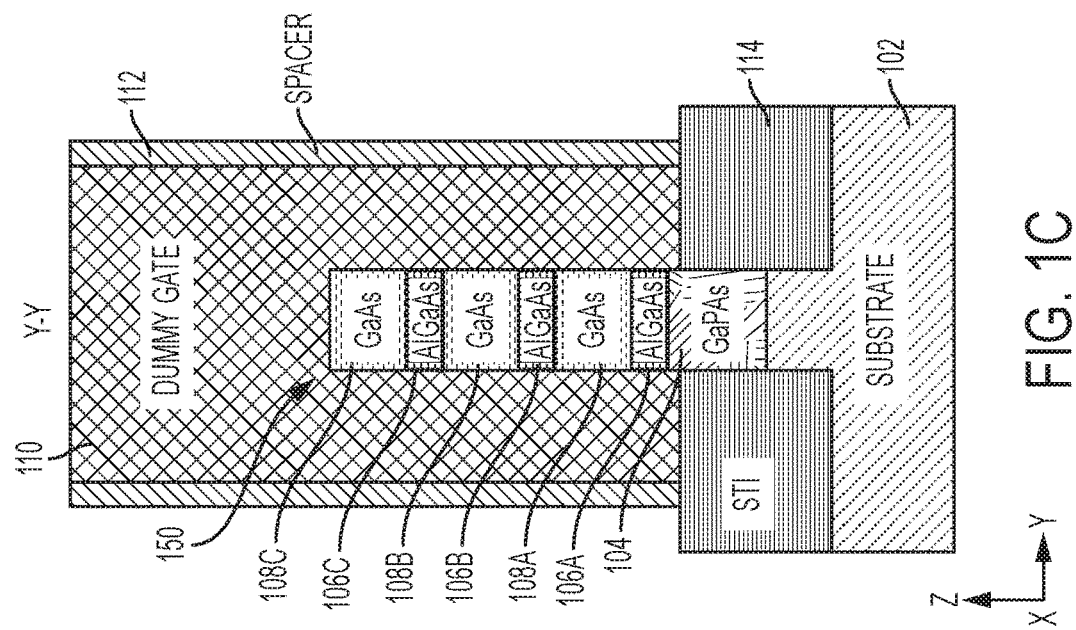
FIG. 1C depicts a cross-sectional view of the semiconductor device shown in FIG. 1A taken along line Y-Y.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, inserted-oxide FinFET (iFinFET) is an emerging transistor architecture to achieve a trade-off between process challenges and electrostatics. The iFinFET splits a fin into multiple segments by inserting a dielectric layer between the segments. Compared with conventional FinFET architectures, the iFinFET has better electrostatics. Compared with gate-all-around (GAA) nanowires/nanosheets, the iFinFET eases process challenges such as inner spacer/gate stack formation. A practical challenge for fabricating the iFinFET is to form the stacked semiconductor/oxide multiple layers. Conceptually, one could use multiple paths of wafer bonding, but such an approach adversely results in a bonding interface in the oxide (i.e., defects in the oxide). Using sacrificial SiGe between adjacent Si segments avoids the multiple wafer bonding issue. However, using SiGe requires the formation of inner spacers which is non-trivial. Therefore, there is a need to improve known iFinFET architectures.

Turning now to an overview of the aspects of the invention, one or more embodiments of the invention address the above-described shortcomings of the prior art by providing a semiconductor device and a method of forming the semiconductor device. Embodiments of the invention take advantage of the volume-shrinking oxidation to produce indented AlGaO between GaAs segments. AlGaO has a greater dielectric constant than $SiO_2$, thereby providing a stronger electric fringe field from metal gate to GaAs segments. Inner spacers are formed without the need of dedicated inner spacer modules. Additionally, the iFinFET device is formed without the need for wafer bonding.

Figure 1B:
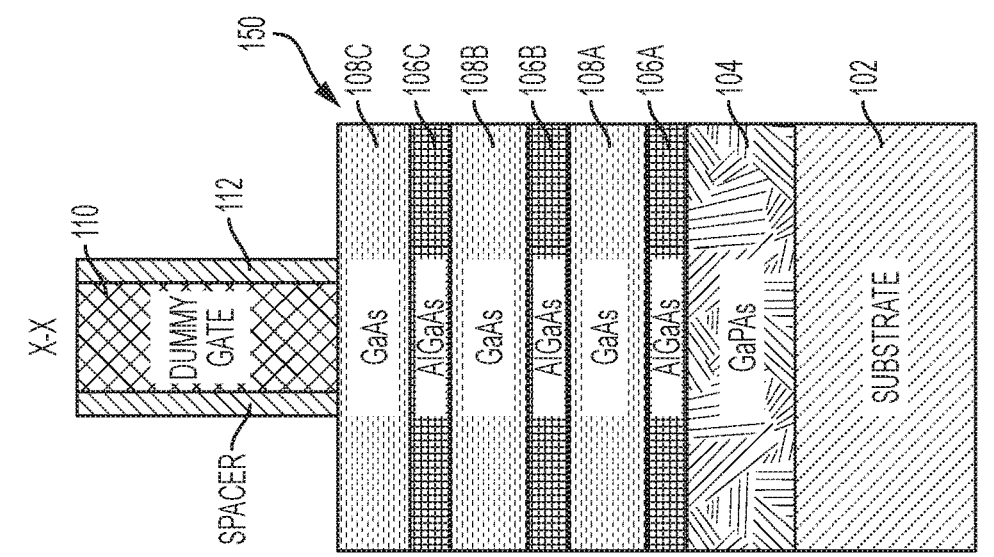
FIG. 1B depicts a cross-sectional view of the semiconductor device shown in FIG. 1A taken along line X-X.
Figure 1A:
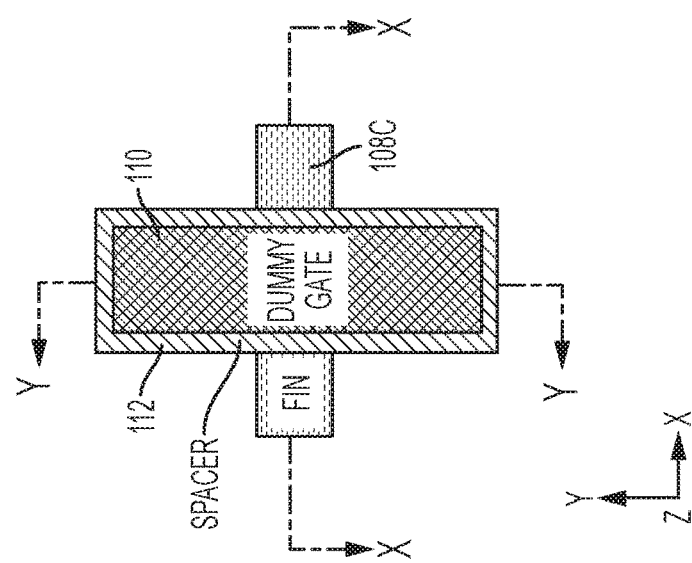
FIG. 1A depicts a top view of a semiconductor device after an initial set of fabrication operations according to embodiments of the invention.

Turning now to a more detailed description of aspects of the present invention, FIGS. 1A to 5C depict a semiconductor device 100 after fabrication operations according to aspects of the invention. More specifically, FIG. 1A depicts a top view of the semiconductor device 100. FIG. 1B depicts a cross-sectional view of the semiconductor device 100 taken along line X-X in FIG. 1A according to embodiments of the invention. FIG. 1C depicts a cross-sectional view of the semiconductor device 100 taken along line Y-Y in FIG. 1A according to embodiments of the invention.

As best shown in FIG. 1B, a buffer layer 104 is epitaxially grown on a substrate 102. The substrate 102 is a semiconductor material. The substrate 102 can be a silicon substrate, although other materials can be used as the substrate 102, for example, a III-V substrate. The substrate can be, for example, a silicon-on-insulator substrate. The buffer layer 104 can be, for example, GaPAs. Other examples materials for the buffer layer 104 can include InGaP and InGaPAs. The buffer layer 104 acts as a passivation layer or transition layer such that the epitaxially grown layers on top do not experience any defects from the substrate 102 below. In some implementations, the buffer layer 104 can optionally be omitted.

A stack 150 of alternating nanosheet/nanowire layers is epitaxially formed on top of the buffer layer 104, as depicted in FIGS. 1B and 1C. The stack 150 includes inserted layers 106A, 106B, and 106C (generally referred to as inserted layer 106) alternating with channel layers 108A, 108B, and 108C (generally referred to as channel layers 108). The layers 106 and 108 have been patterned to form the fin stack 150. The inserted layer 106A, 106B, and 106B can be, for example, AlGaAs. Although AlGaAs works better for conversion to an oxide as discussed further herein, other example materials for the inserted layer 106A, 106B, and 106B include AlAs and InAlAs. The channel layers 108A, 108B, and 108C can be, for example, GaAs. Other example materials for the channel layers can include III-V compound semiconductor materials. In general, III-V compound semiconductors are obtained by combining group III elements (e.g., Al, Ga, In) with group V elements (e.g., N, P, As, Sb).

Shallow trench isolation (STI) regions 114 are formed in part of the buffer layer 104 and the substrate 102, as depicted in FIG. 1C. The buffer layer 104 and the substrate 102 are etched in preparation for STI regions 114. Accordingly, the material of the STI regions 114 is deposited and recessed. The STI regions 114 can be, for example, an oxide material.

A dummy gate 110 is formed on top of the stack 150. The dummy gate 110 is deposited and patterned to be on top of the stack 150 in FIG. 1B and encapsulate the stack 150 in FIG. 1C. Example materials for the dummy gate 110 can include, for example, dielectric materials, amorphous silicon, polysilicon, amorphous carbon, etc.

A spacer 112 is formed on the dummy gate 110, as illustrated in FIGS. 1A, 1B, and 1C. The spacer 112 can be deposited and patterned to be on the sides of the dummy gate 110. The spacer 112 can be, for example, a dielectric material such as silicon nitride, SiBCN, SiOCN, etc. The dummy gate 110 and spacer 112 are utilized to pattern the fin stack 150.

FIG. 2A depicts a top view of the semiconductor device 100 according to embodiments of the invention. FIG. 2B depicts a cross-sectional view of the semiconductor device 100 taken along line X-X in FIG. 2A according to embodiments of the invention. FIG. 2C depicts a cross-sectional view of the semiconductor device 100 taken along line Y-Y in FIG. 2A according to embodiments of the invention. It should be appreciated that some details of the top view might be omitted to view underlying details.

The fin stack 150 and the buffer layer 104 are recessed in the source or drain (S/D) regions, as depicted in FIG. 2B. A directional reactive ion etch (ME) can be performed to recess the fin stack 150 and buffer layer 104. After recessing, S/D epitaxial layers 202, also referred to as S/D epi, are epitaxially grown from the ends of the fin stack 150 and the top of the buffer layer 104, as depicted in FIGS. 2A and 2B. It is noted that no inner spacers are formed prior to growing the S/D epitaxial layers 202 as normally performed in the state-of-the-art. For example, FIG. 2B illustrates that the ends of inserted layers 106A, 106B, 106C abut or directly touch the S/D epitaxial layers 202. However, in the state-of-the-art, a fabrication process is needed to form inner spaces prior growing the S/D epitaxial layers 202.

An interlevel dielectric (ILD) material 204 is formed in FIGS. 2A, 2B, and 2C. The ILD material 204 is deposited and chemical mechanical polishing/planarization (CMP) is performed. The ILD material 204 is a low-k dielectric material, such as, for example, a low-k oxide material, a nitride material, etc.

FIG. 3A depicts a top view of the semiconductor device 100 according to embodiments of the invention. FIG. 3B depicts a cross-sectional view of the semiconductor device 100 taken along line X-X in FIG. 3A according to embodiments of the invention. FIG. 3C depicts a cross-sectional view of the semiconductor device 100 taken along line Y-Y in FIG. 3A according to embodiments of the invention. It should be appreciated that some details of the top view might be omitted to view underlying details.

The dummy gate 110 is removed to leave a trench 302, as part of the replacement metal gate process, as depicted in FIGS. 3A, 3B, and 3C. For example, the dummy gate 110 can be removed by selective etching.

FIG. 4A depicts a top view of the semiconductor device 100 according to embodiments of the invention. FIG. 4B depicts a cross-sectional view of the semiconductor device 100 taken along line X-X in FIG. 4A according to embodiments of the invention. FIG. 4C depicts a cross-sectional view of the semiconductor device 100 taken along line Y-Y in FIG. 4A according to embodiments of the invention. It should be appreciated that some details of the top view might be omitted to view underlying details.

Oxidation of the inserted layers 106A, 106B, 106C is performed to create oxide/oxidized layers 406A, 406B, 406C in between the channel layers 108A, 108B, 108C, as depicted in FIGS. 4B and 4C. For example, a selective oxidation is performed on the inserted layers 106A, 106B, 106C such that the high aluminum content in the AlGaAs inserted layers 106A, 106B, 106C is particularly oxidized, resulting in AlGaO oxide/oxidized layers 406A, 406B, 406C. The arsenic-related reaction product is volatile and is removed from the formed oxide, i.e., oxidized layers 406A, 406B, 406C. The oxidation can be wet or dry chemistry to form oxide/oxidized layers 406A, 406B, 406C. The chemistry to oxidize the AlGaAs can include $H_2O$ and $H_2$. Prior to oxidation, the AlGaAs inserted layers 106A, 106B, 106C contain about 90% atomic percent or more of aluminum in the AlGaAs. Containing such a high atomic percent of aluminum and the volatility of arsenic in the reaction allows the AlGaAs to be selectively (selective to GaAs) oxidized to AlGaO, and causes the removal of arsenic which contributes to the shrinkage. Therefore, this results in a shrinkage of oxide volume of the newly formed AlGaO oxide/oxidized layers 406A, 406B, 406C compared with the original AlGaAs inserted layers 106A, 106B, 106C. For example, the oxide/oxidized layers 406A, 406B, 406C have a shorter length than the channel layers 108A, 108B, 108C (and the original inserted layers 106A, 106B, 106C) in the y-axis of FIG. 4C. Further, the oxide/oxidized layers 406A, 406B, 406C each have an indent 402 at or near the middle, as a result of the shrinkage of oxide volume. As illustrated in FIG. 4C, the indents 402 are further recessed from the edges of the oxide/oxidized layers 406A, 406B, 406C, thereby forming an hour glass shape. Also, the AlGaO oxide/oxidized layers 406A, 406B, 406C serve as inner spacers to isolate metal gate (in next) from the S/D region and isolate the oxide/oxidized layers 406A, 406B, 406C from one another. In state-of-the-art iFinFET devices, inner spacers are formed on the edges of the inserted layers by removing sacrificial layers and forming inner spacers between the channel layers. Alternatively, in state-of-the-art iFinFET devices, inner spacers are formed to replace sacrificial layers after the sacrificial layers between the channel layers have been removed.

Figure 5C:
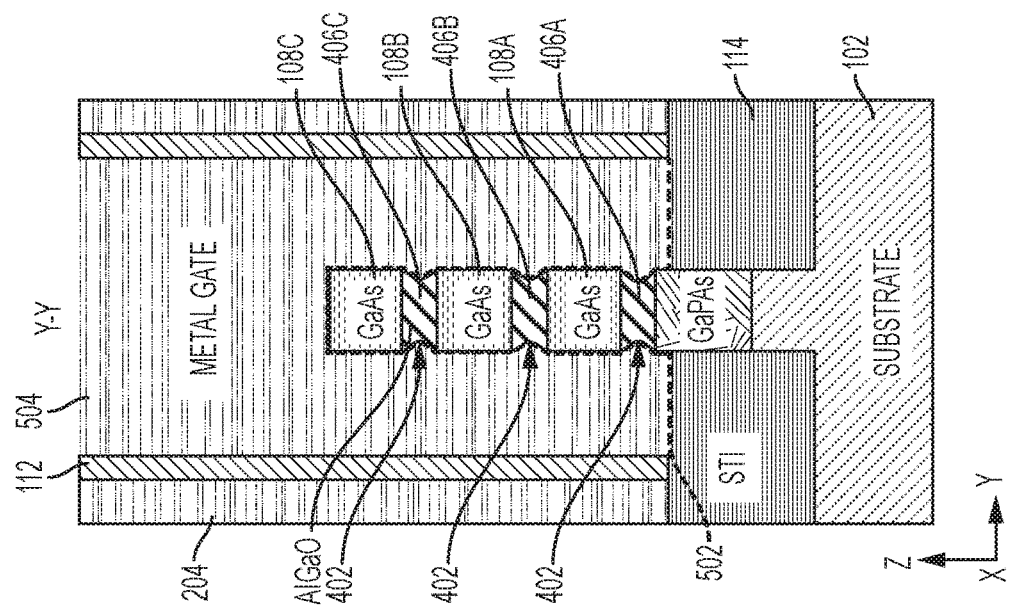
FIG. 5C depicts a cross-sectional view of the semiconductor device shown in FIG. 5A taken along line Y-Y.
Figure 5B:
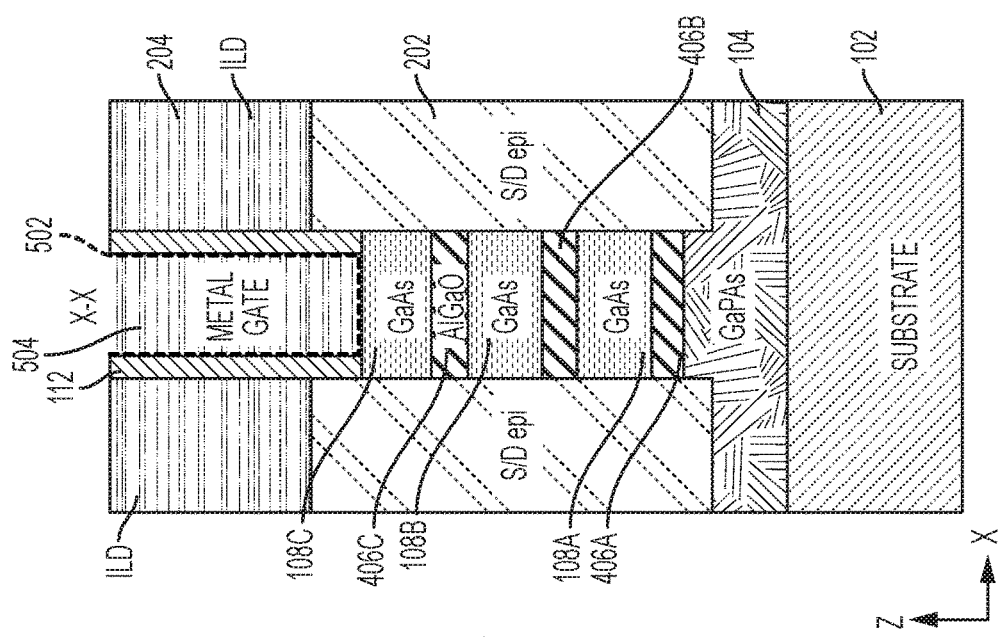
FIG. 5B depicts a cross-sectional view of the semiconductor device shown in FIG. 5A taken along line X-X.
Figure 5A:
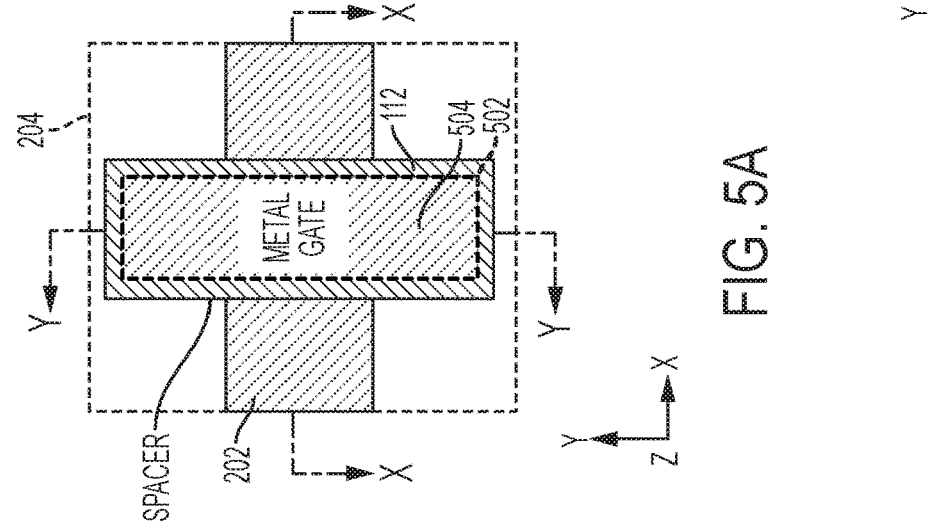
FIG. 5A depicts a top view of the semiconductor device after fabrication operations according to embodiments of the invention.

FIG. 5A depicts a top view of the semiconductor device 100 according to embodiments of the invention. FIG. 5B depicts a cross-sectional view of the semiconductor device 100 taken along line X-X in FIG. 5A according to embodiments of the invention. FIG. 5C depicts a cross-sectional view of the semiconductor device 100 taken along line Y-Y in FIG. 5A according to embodiments of the invention. It should be appreciated that some details of the top view might be omitted to view underlying details.

With the AlGaO oxide/oxidized layers 406A, 406B, 406C as the oxide between the channel layers 108A, 108B, 108C, the iFinFET flow continues by forming the high-k dielectric material 502, metal gate 504, contacts (not shown), etc., as illustrated in FIGS. 5A, 5B, and 5C.

The high-k dielectric material 502 can include one or more high-k materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum.

The metal gate 504 can include one or more work function metals. Example work function metals can include TiN, TiC, TiCAl, TaN, or any other metals used in the state of the art.

Technical advantages and benefits include a III-V iFinFET without the need of wafer bonding. Since the inserted oxide, for example AlGaO, is formed via selective oxidation of AlGaAs, the initial stack is a semiconductor stack that can be formed via epitaxy. Thus, embodiments of the invention avoid the need and complexity of forming semiconductor and oxide stack via multiple paths of wafer bonding. Embodiments of the invention advantageously employ the volume-shrinking oxidation process to produce the indented AlGaO (or $AlGa_yO_x$ where x is an integer from 1-5, where y is an integer from 1-5) between GaAs segments (e.g., channel layers 108A, 108B, 108C). AlGaO has a greater dielectric constant than SiO2, which provides a stronger magnetic fringe field from metal gate to GaAs segments, thereby having better electrostatics. Inner spacers (e.g., oxide layers 406A, 406B, 406C) are formed without the need of a dedicated inner spacer module, and no separate fabrication process is needed to form a dedicated inner spacer.

According to one or more embodiments of the invention, a method of forming a semiconductor device 100 is provided. The method includes forming a stack 150 of alternating layers of inserted layers 106A, 106B, 106C and channel layers 108A, 108B, 108C on a substrate 102 and forming source or drain (S/D) regions 202 on opposite sides of the stack 150. The method includes converting the inserted layers 106A, 106B, 106C into oxide layers 406A, 406B, 406C and forming gate materials (e.g., high-k dielectric material 502 and gate metal 504) on the stack 150.

Converting the inserted layers 106A, 106B, 106C into the oxide layers 406A, 406B, 406C causes material of the oxide layers to shrink. Converting the inserted layers 106A, 106B, 106C into the oxide layers 406A, 406B, 406C causes an indent 402 in the oxide layers. The oxide layers 406A, 406B, 406C separate the channel layers 108A, 108B, 108C in the stack 150. The oxide layers 406A, 406B, 406C are non-conductive current insulators, and the channel layers 108A, 108B, 108C are conductive. The inserted layers 106A, 106B, 106C include AlGaAs. The oxide layers 406A, 406B, 406C include AlGaO. The method includes forming a buffer layer 104 on the substrate 102 prior to forming the stack 150. The material of the buffer layer 104 includes GaPAs.

According to one or more embodiments of the invention, a method of forming a semiconductor device 100 is provided. The method includes forming a stack 150 of alternating layers of oxide layers 406A, 406B, 406C and channel layers 108A, 108B, 108C on a substrate 102, the oxide layers having an indented middle portion 402. The method includes forming source or drain (S/D) regions 202 on opposite sides of the stack 150 and forming gate materials (e.g., high-k dielectric material 502 and gate metal 504) on the stack 150.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a $\{100\}$ crystal surface will take on a $\{100\}$ orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a stack of alternating layers of oxide layers and channel layers on a substrate, the oxide layers having an indented middle portion;
   source or drain (S/D) regions on opposite sides of the stack; and
   gate materials on the stack, the indented middle portion being filled with gate metal of the gate materials.

2. The semiconductor device of claim 1, wherein the oxide layers separate the channel layers in the stack.

3. The semiconductor device of claim 1, wherein the oxide layers comprise AlGaO.

4. The semiconductor device of claim 1, wherein the channel layers comprise GaAs.

5. The semiconductor device of claim 1, wherein the oxide layers are non-conductive.

6. The semiconductor device of claim 1, wherein the channel layers are conductive, the indented middle portion of the oxide layers having the gate metal on opposite ends in a length dimension.

7. The semiconductor device of claim 1, wherein a buffer layer is between the stack and the substrate.

8. The semiconductor device of claim 7, wherein the buffer layer comprises GaPAs.

9. The semiconductor device of claim 1, wherein the gate materials comprise a high-k dielectric material.

10. The semiconductor device of claim 9, wherein the gate materials further comprise a gate metal on the high-k dielectric material.

11. A method of forming a semiconductor device, the method comprising:
    forming a stack of alternating layers of oxide layers and channel layers on a substrate, the oxide layers having an indented middle portion;
    forming source or drain (S/D) regions on opposite sides of the stack; and
    forming gate materials on the stack, the indented middle portion being filled with gate metal of the gate materials.

12. The method of claim 11, wherein the oxide layers separate the channel layers in the stack.

13. The method of claim 11, wherein the oxide layers comprise AlGaO.

14. The method of claim 11, wherein the channel layers comprise GaAs.

15. The method of claim 11, wherein the oxide layers are non-conductive.

16. The method of claim 11, wherein the channel layers are conductive.

17. The method of claim 11, wherein a buffer layer is formed between the stack and the substrate.

18. The method of claim 17, wherein the buffer layer comprises GaPAs.

19. The method of claim 11, wherein the gate materials comprise a high-k dielectric material.

20. The method of claim 19, wherein the gate materials further comprise a gate metal on the high-k dielectric material.

* * * * *